(12) United States Patent
Valluri et al.

(10) Patent No.: US 6,507,100 B1
(45) Date of Patent: Jan. 14, 2003

(54) CU-BALANCED SUBSTRATE

(75) Inventors: Viswanath Valluri, Sunnyvale, CA (US); Edwin Fontecha, San Jose, CA (US); Melissa Siow-Lui Lee, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/772,888

(22) Filed: Jan. 31, 2001

Related U.S. Application Data

(60) Provisional application No. 60/214,422, filed on Jun. 28, 2000.

(51) Int. Cl.[7] .............................................. H01L 23/48
(52) U.S. Cl. ........................ 257/697; 257/691; 257/693; 257/696
(58) Field of Search ................................. 257/691, 693, 257/696, 697, 701, 735, 737, 773; 361/380, 396, 762, 766; 367/760, 771, 808; 174/52.4, 262

(56) References Cited

U.S. PATENT DOCUMENTS

| | | | | |
|---|---|---|---|---|
| 5,535,101 A | * | 7/1996 | Miles et al. ................. | 174/260 |
| 5,686,699 A | * | 11/1997 | Chu et al. .................... | 174/250 |
| 5,767,575 A | * | 6/1998 | Lan et al. .................... | 257/701 |
| 5,942,795 A | * | 8/1999 | Hoang ......................... | 257/692 |
| 6,147,876 A | * | 11/2000 | Yamaguchi et al. ......... | 257/698 |
| 6,181,009 B1 | * | 1/2001 | Takahashi et al. ........... | 257/735 |
| 6,271,583 B1 | * | 8/2001 | Sakoda et al. ............... | 257/693 |
| 6,310,398 B1 | * | 10/2001 | Katz ............................ | 257/690 |

* cited by examiner

*Primary Examiner*—David Nelms
*Assistant Examiner*—Dao H. Nguyen

(57) ABSTRACT

A packaging substrate is formed with electrically non-functional areas of Cu on the upper surface and/or lower surface for improved strength and rigidity and reduced warpage and bending. Embodiments of the present invention include substrates containing electrically non-functional grid-like Cu areas on the upper and lower surface such that the ratio of the total Cu area on one surface is about 55% to about 100% of the total Cu area on the other surface.

15 Claims, 5 Drawing Sheets

CU-BALANCED SUBSTRATE

RELATED APPLICATION

This application claims priority from provisional patent application Serial No. 60/214,422 filed on Jun. 28, 2000 entitled "CU-BALANCED SUBSTRATE", the entire disclosure of which is hereby incorporated by referenced herein.

TECHNICAL FIELD

The present invention relates to semiconductor packaging technology. The present invention has particular applicability to semiconductor packages containing a substrate comprising fan-out circuitry electrically interconnected by vias.

BACKGROUND ART

Ongoing advances in solid-state electronic devices impose continuous demands for integrated circuit devices with increased functionality, density, and performance. In response, multi-chip modules have evolved comprising a printed circuit board substrate to which a series of separate components are directly attached. Multi-chip devices advantageously increase circuit density with attendant improvements in signal propagation speed and overall device weight.

Integrated circuit devices are typically electronically packaged by mounting one or more chips to a substrate, e.g., an alumna circuitized substrate or a copper plated organic substrate, sometime referred to as a chip carrier. Wire bonds are employed to electrically connect input/output (IO) contact pads on each chip to corresponding fan-out circuitry on the circuitized chip carrier substrate. The resulting chip carrier is then typically mounted on a printed circuit board (PCB) and, employing circuitry on the PCB, electrically coupled to other such chip carriers and/or other electronic components mounted on the PCB.

Conventional organic circuitized substrates contain two or more layers of fan-out circuitry on two or more BT layers. Such layers of fan-out circuitry are electrically interconnected by mechanically drilled holes known as vias which are plated and/or filled with electrically conductive material, e.g., copper. Some of the holes extend from the layers of fan-out circuitry to respective lands on the chip carrier substrates, on which are mounted solder balls forming a grid array, thereby generating the expression "ball grid array". The solder balls are mechanically and electrically connected to corresponding solderable contact pads on the PCB.

Unfortunately, the mechanically drilled holes or vias electrically interconnecting the layers of fan-out circuitry have very large diameters, requiring the spacing between the fan-out wires to be relatively large, thereby limiting the number of chip I/O pads which can be accommodated by the multilayered substrates. Moreover, conventional practices comprise forming the vias in aligned rows. For example, adverting to FIG. 1, an upper surface of chip carrier substrate 10 comprises two rows of substantially aligned vias, one row:of vias substantially aligned with via 11 and another row of vias aligned with via 12. Circuitry lines from such vias illustrated by reference numeral 13 with respect to vias aligned with via 11 and reference number 13A with respect to vias aligned with via 12. The bottom surface of chip carrier substrate 10 is chemically illustrated in FIG. 2 and comprises vias 11 and 12, solder balls 22, and circuitry wiring 23. Such chip carrier substrates have been found to cause failures during various assembling stages, such as die-attaching a semiconductor die or chip to the upper surface of the substrate and molding to encapsulate the semiconductor die on the substrate with a molding compound. In addition, such chip arricer substrates have been found to undergo warpage and bending.

Accordingly, there exists a need for chip carrier substrates exhibiting high strength and rigidity and resistance to warpage and bending for use in semiconductor packaging.

SUMMARY OF THE INVENTION

An advantage of the present invention is a chip carrier substrate exhibiting high strength and rigidity and improved resistance to warpage and bending.

Additional advantages and features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a substrate for attaching a semiconductor die to a printed circuit board, the substrate comprising: an upper surface containing electrically functional metal lines; and a lower surface containing electrically functional metal lines; wherein, at least one of the upper and lower surfaces contains an electrically non-functional metal area for improved strength and rigidity and reduced warpage and bending.

Embodiments of the present invention comprise substrates wherein each of the upper surface and lower surface contains at least one electrically non-functional area of copper (Cu) or a Cu alloy, as in the form of a grid. Embodiments of the present invention further include substrates wherein the ratio of the total area of electrically functional lines and electrically non-functional Cu or Cu alloy areas on one of the upper surface and lower surface is about 55% to about 100%, such as about 60% to about 80%, of the total area of the electrically functional lines and electrically non-functional Cu or Cu alloy areas on the other of the lower surface and the upper surface of the substrate. Embodiments of the present invention further comprise substrates having vias extending through the substrate between the upper and lower surfaces interconnecting the electrically functional Cu or Cu alloy lines on the upper and lower surfaces, wherein the vias are offset from one another such that less than 20% of the vias are aligned. Embodiments of the present invention further comprise substrates having at least 48 vias interconnecting fan-out circuitry, and further include a circuit assembly comprising at least one semiconductor die attached to a printed circuit board by means of a substrate in accordance with the present invention.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawing and description is to be regarded as illustrative in nature, and not as restrictive.

DESCRIPTION OF THE PRESENT INVENTION

Figure 1:
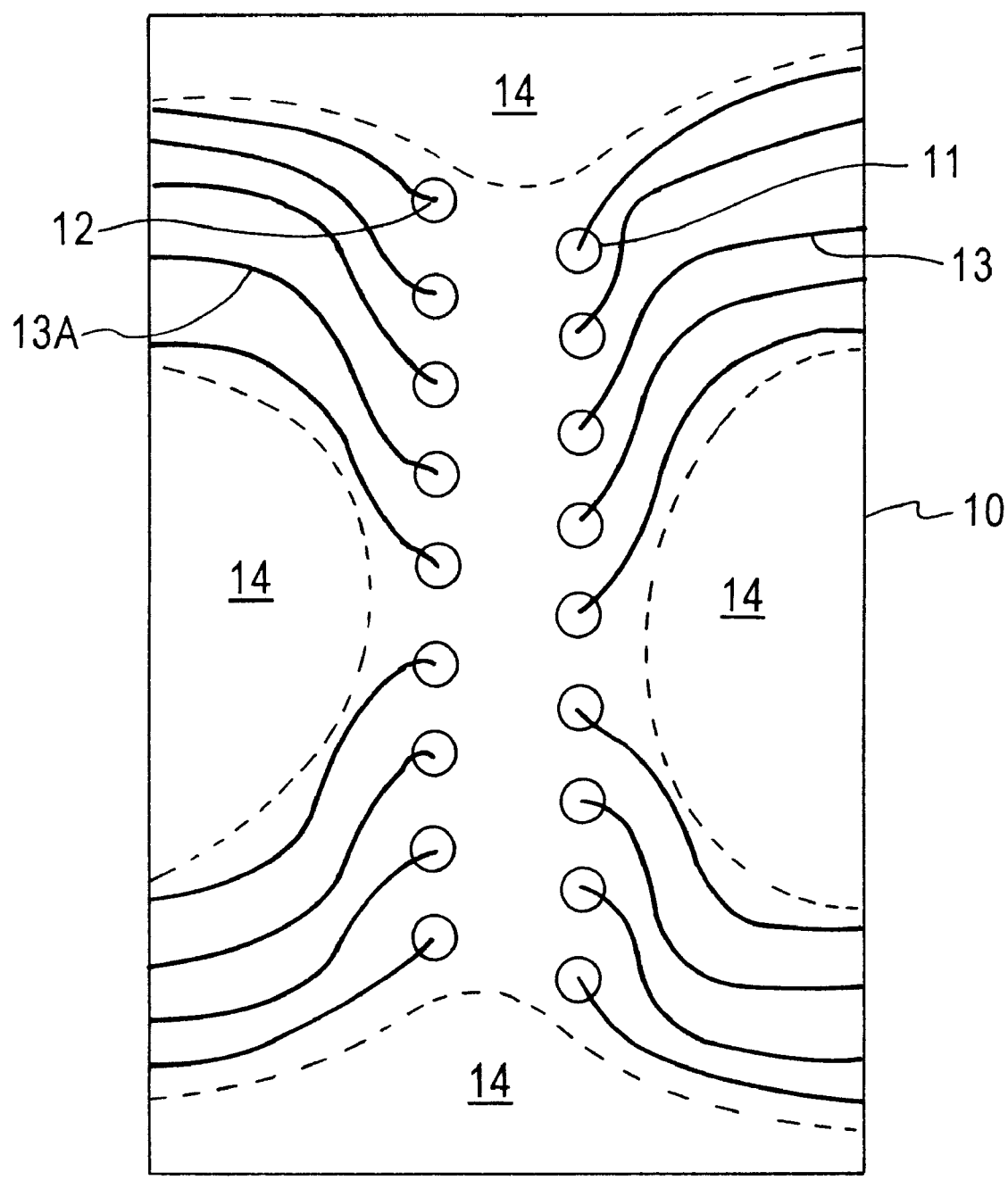
FIG. 1 schematically illustrates, in plan view, an upper surface of a conventional chip carrier substrate.
Figure 2:
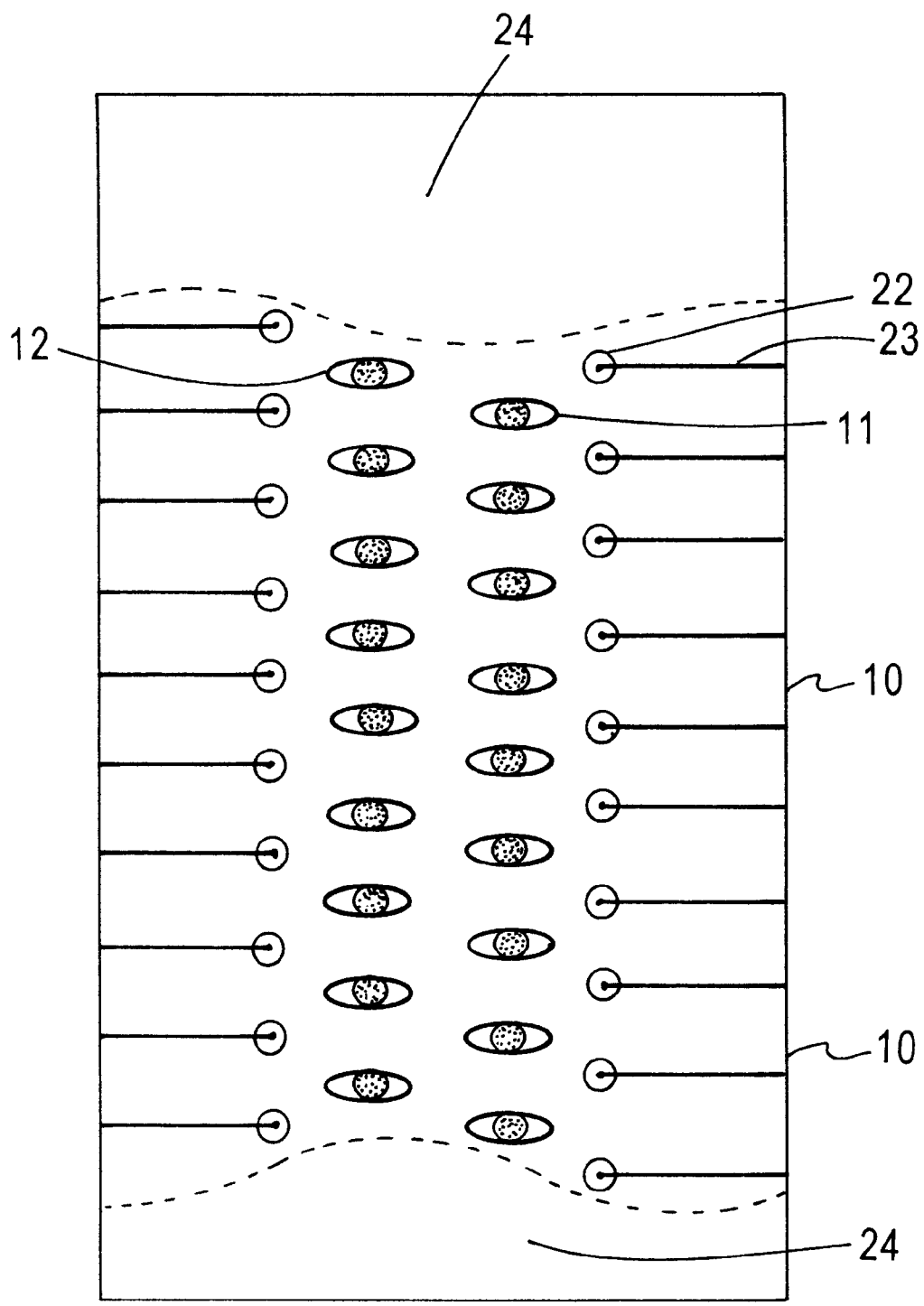
FIG. 2 schematically illustrates, in plan view, a lower surface of a conventional chip carrier substrate.

Upon investigating various failures of chip carrier substrates when attaching a semiconductor die thereto and during encapsulation with a molding compound, it was determined that a significant source of such failures stemmed from mechanical weaknesses, such as a reduction in strength and rigidity of the chip carrier substrate because of the mechanically drilled holes or vias extending therethrough. Conventional practices, as shown in FIGS. 1 and 2, comprise forming the vias in aligned rows. It was determined that such alignment of the vias significantly reduces strength and rigidity, resulting in failures during various packaging stages.

In copending U.S. patent application Ser. No. 09/772,889 filed on Jan. 31, 2001, the strength and rigidity problems stemming from aligned vias are addressed by providing a chip carrier substrate with vias that are offset from one another such that less than 20% of the vias are aligned. The invention disclosed in copending application Ser. No. 09/772,889 (52352-514) is effective in improving the strength and rigidity of circuitized substrates. However, there remains a need for hip carrier substrates which also exhibit improved resistance to warpage and bending.

Upon further investigation of chip carrier substrates which exhibited warpage and bending during various high temperature packaging stages, it was determined that a significant cause of warpage and bending stemmed from a difference in the coefficients of thermal expansion between the upper and lower surfaces of the chip carrier substrate. Such a difference in surface coefficients of thermal expansion is believed to be primarily due to the imbalance in the areas of the fan-out circuitry between the upper and lower surfaces, i.e., metal traces or lines. As shown in FIGS. 1 and 2, the upper surface of substrate 10 contains vacant areas 14 while the lower surface of the substrate 10 contains vacant areas 24.

Having uncovered a significant source of the circuitized substrate warpage and bending problem, efforts were undertaken to determine effective remedial action, i.e., to increase the resistance of a circuitized substrate to warpage and bending of chip carrier substrates. In accordance with embodiments of the present invention, circuitized substrate warpage and bending are reduced by providing at least one of the upper and lower surfaces of the substrate with an additional metal area which is electrically nonfunctional, i.e., a dummy metal area. The term "nonfunctional", as employed herein throughout the specification and claims, is intended to denote a metal area, such as Cu or a Cu alloy, which does not function in an electrical manner in the integrated circuit system of the semiconductor package. The term "Cu", as used herein throughout the specification and claims, is intended to encompass elemental copper as well as electrically conductive copper-based alloys.

Embodiments of the present invention comprise providing at least one electrically nonfunctional Cu or Cu alloy area on each of the upper and lower surfaces of the chip carrier substrate to achieve a balance in the total Cu or Cu alloy area, functional and nonfunctional, on the upper and lower surfaces to substantially equalize their respective coefficients of thermal expansion, thereby avoiding warpage or bending. Advantageously, such dummy, electrically nonfunctional Cu or Cu alloy areas on the upper and lower surfaces significantly improve the strength and rigidity of the substrate.

Embodiments of the present invention comprise providing circuitized chip carrier substrates having at least one dummy or electrically nonfunctional Cu or Cu alloy area on each of the upper and lower surfaces, such that the ratio of the total Cu or Cu alloy area both functional and nonfunctional on one of the upper and lower surfaces to the other is between 55% to 100%, such as about 60% to about 80%, e.g., about 70%. Such electrically nonfunctional Cu or Cu alloy areas can be provided in the form of a grid and can be deposited in a manner similar to the depositing the functional lines, e.g., electroplating or chemical vapor deposition.

Further embodiments of the present invention comprise circuitized chip carrier substrates comprising electrically nonfunctional Cu or Cu alloy areas together with staggered vias as disclosed in copending application Ser. No. 09/772,889 for optimum strength and rigidity. Accordingly, embodiments of the present invention further include substrates with vias interconnecting fan-out circuitry or electrically functional Cu or Cu alloy lines on the upper and lower surfaces, wherein the vias are purposefully staggered so that they are not aligned in rows as in conventional practices. The term "aligned" as employed in the specification and claims, is intended to denote that a single straight line can be drawn between vias. In accordance with the present invention, the vias are purposely staggered or nonaligned such that less than 20% of the vias are aligned and can be interconnected by a straight line. Thus, in accordance with embodiments of the present invention, in excess of 80% of the vias are staggered or nonaligned.

Embodiments of the present invention comprise chip carrier substrates having conventional fan-out circuitry on upper and lower layers interconnected by staggered or nonaligned vias. Embodiments of the present invention include fan-out circuitry having at least 48 vias, less than 20% of which are aligned. It was found that purposely staggering the vias such that in excess of 80% of the vias are offset from one another with respect to a straight line, in addition to providing electrically nonfunctional metal areas to balance the surface coefficients of thermal expansion, significantly improve strength and rigidity, as well as reduce warpage and bending, thereby significantly reducing the rejection rate.

Figure 3:
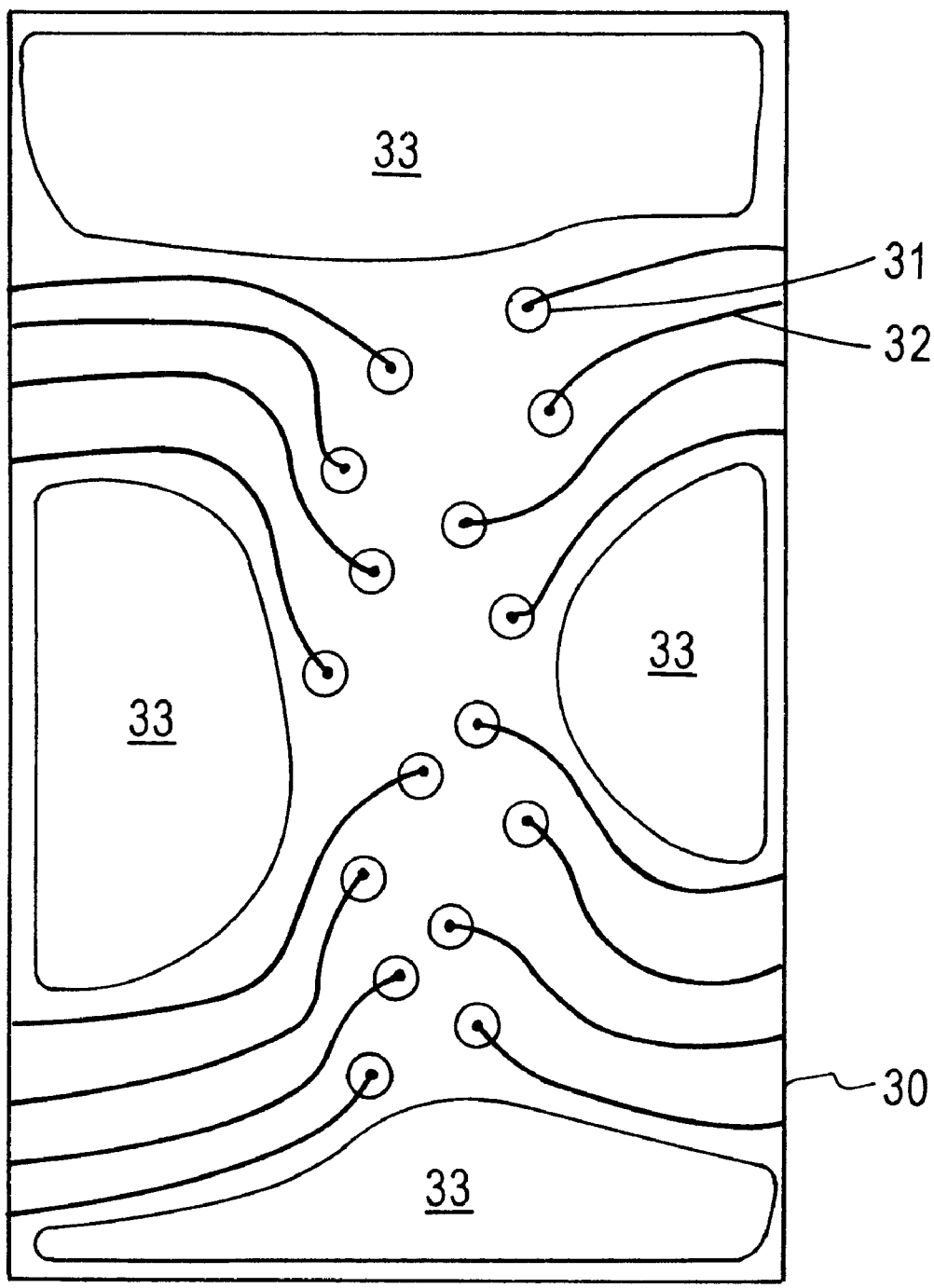
FIG. 3 schematically illustrates, in plan view, an upper surface of a chip carrier substrate in accordance with an embodiment of the present invention.
Figure 4:
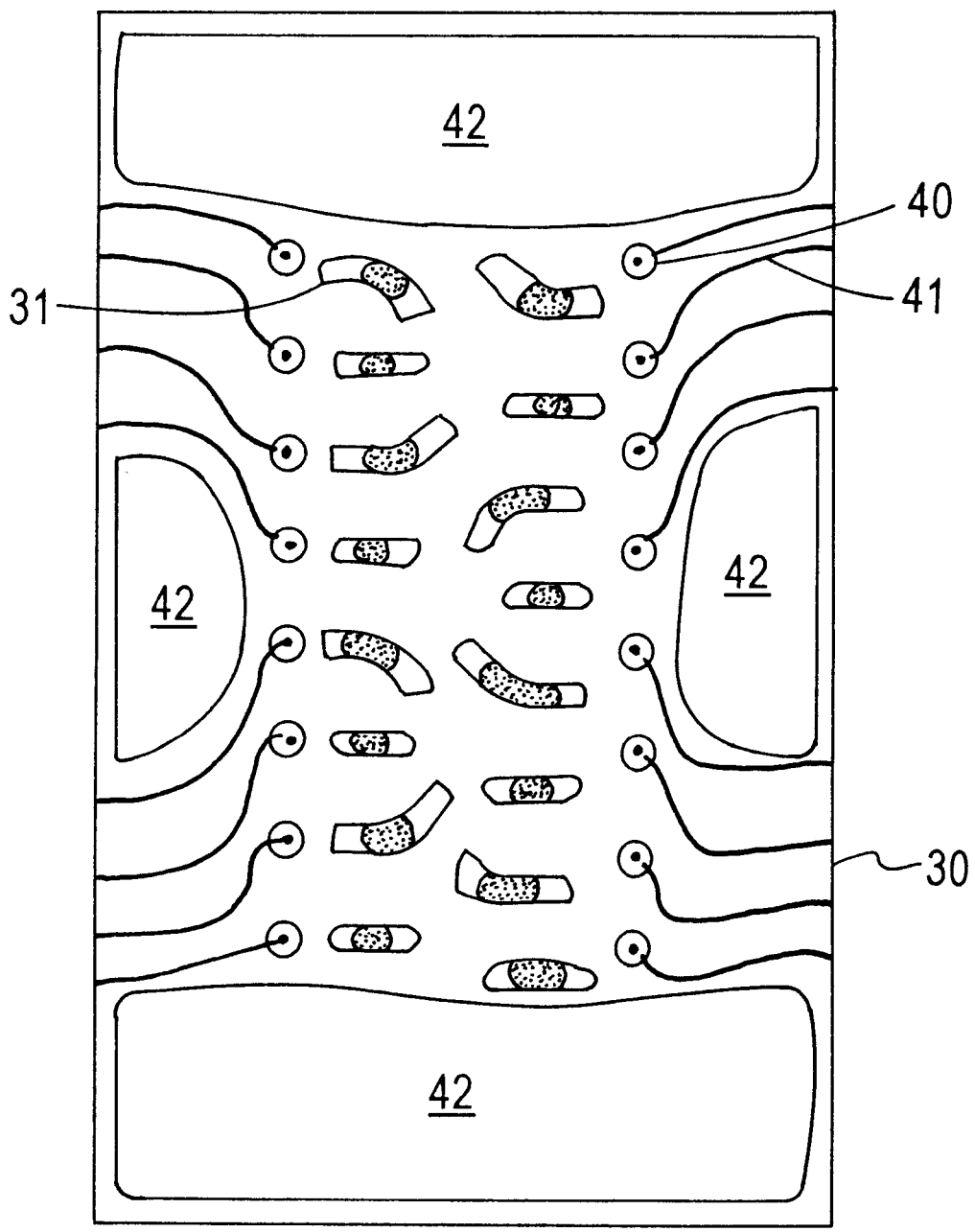
FIG. 4 schematically illustrates, in plan view, a lower surface of a chip carrier substrate in accordance with an embodiment of the present invention.

An embodiment of the present invention is schematically illustrated in FIGS. 3 and 4. Adverting to FIG. 3, the upper surface of substrate 30 is provided with dummy areas 33 of electrically nonfunctional Cu occupying previous vacant areas 14 (FIG. 1). In addition, vias 31 are purposely staggered or nonaligned vis-à-vis the aligned structure shown in FIG. 1. Such staggering of vias 30 provides greater strength and rigidity vis-à-vis the aligned via structure of FIG. 1. Reference numeral 32 denotes circuit lines extending from vias 31.

Adverting to FIG. 4, the bottom surface of substrate 30 is provided with dummy areas 42 of electrically nonfunctional Cu occupying previous vacant areas 24 (FIG. 2). The provision of dummy areas 33 on the upper surface of substrate 30 and dummy areas 42 on the lower surface of substrate 30 create a balanced metallized substrate minimizing any difference between the coefficients of thermal expansion of the upper and lower surfaces, thereby preventing warpage and bending.

As also shown in FIG. 4, vias 31 are staggered as seen on the bottom surface of chip carrier substrate 30. Also shown in FIG. 4 are solder balls 40 with conductive lines 41 extending therefrom. The provision of dummy areas 33 on the upper surface (FIG. 3) and dummy areas 42 on the lower surface of substrate 30 (FIG. 4) comprising electrically nonfunctional metal, such as Cu or a Cu alloy, not only improves the metallization balance thereby reducing warpage and bending, but also improves the strength and rigidity of the substrate. Optimum improvement in strength and rigidity can be further obtained by additionally staggering the vias.

Figure 5:
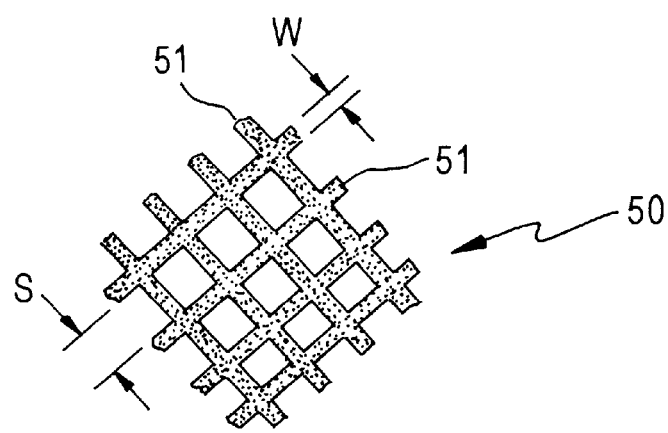
FIG. 5 schematically illustrates a non-functional metal grid for use in embodiments of the present invention.

Dummy, electrically nonfunctional metallized areas in accordance with embodiments of the present invention can be provided in the form of a grid 50, as illustrated in FIG. 5, comprising lines 51 having a width (W) of about 70 microns to about 100 microns, e.g., about 100 microns, and a spacing(s) of about 80 microns to about 300 microns, e.g., about 200 microns.

Figure 6:
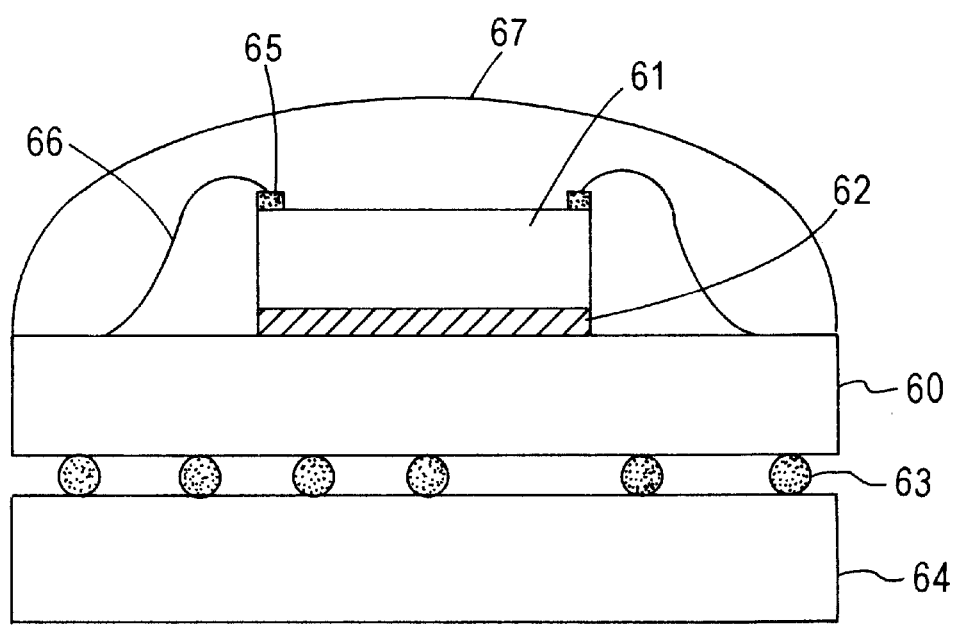
FIG. 6 schematically illustrates a circuit assembly comprising a chip carrier substrate in accordance with an embodiment of the present invention.

Embodiments of the present invention comprising a chip carrier substrate with balanced metallization for resistance to warpage and bending and improved strength and rigidity, with or without staggered vias, can be employed in fabricating any of various types of semiconductor packages. For example, as shown in FIG. 6, chip carrier substrate 60 in accordance with an embodiment of the present invention can be employed with a semiconductor die 61 attached thereto with an epoxy resin 62. Solder balls 63 are employed to attach chip carrier substrate 60 to a printed circuit board 64. Bond pads 65 are electrically connected to conductors (not shown) on the surface of substrate 60 by bond wires 66. Semiconductor die 61 is encapsulated on substrate 60 by molding compound 67.

In accordance with embodiments of the present invention, a chip carrier substrate is provided with dummy, electrically nonconductive metallized areas for balanced metallization thereby equalizing the coefficients thermal expansion of the upper and lower substrate surfaces and, hence, preventing warpage and bending, as well as significantly improving strength and rigidity. In addition, staggered vias can be provided offset from one another, such that less than 20% of the vias are aligned to further improve substrate strength and rigidity vis-à-vis conventional practices wherein the vias are aligned in rows.

The present invention enjoys industrial applicability in manufacturing any of various types of semiconductor packaging wherein semiconductor dies are attached to printed circuit boards by means of a substrate.

Only the preferred embodiment of the present invention and an example of its versatility are shown and described in the present disclosure. It is to be understood that the present invention is capable of use in various other combinations and environments, and is capable of changes or modifications within the scope of the inventive concept as expressed herein.

What is claimed is:

1. A substrate for attaching a semiconductor die to a printed circuit board, the substrate comprising:

an upper surface containing electrically functional metal lines; and a lower surface containing electrically functional metal lines; wherein, at least one of the upper and lower surfaces further contains an electrically non-functional metal area for improved strength and rigidity and reduced warpage and bending.

2. The substrate according to claim 1, wherein the metal for the functional lines and the metal for the electrically non-functional area comprises copper (Cu) or a Cu alloy.

3. The substrate according to claim 2, wherein each of the upper surface and the lower surface contains at least one electrically non-functional area of Cu or a Cu alloy.

4. The substrate according to claim 3, wherein the at least one electrically non-functional area is in the form of a grid.

5. The substrate according to claim 3, wherein the ratio of the total area of electrically functional lines and electrically non-functional area or areas on one of the upper surface or the lower surface is about 55% to about 100% of the total area of electrically functional lines and electrically non-functional area or areas on the other of the lower surface or the upper surface.

6. The substrate according to claim 5, wherein the ratio is about 60% to about 80%.

7. The substrate according to claim 5, comprising vias extending through the substrate between the upper and lower surfaces, wherein the vias are offset from one another such that less than 20% of the vias are aligned.

8. The substrate according to claim 7, comprising at least 48 vias.

9. The substrate according to claim 7, wherein:

the vais electrically connect the Cu or Cu alloy functional lines on the upper and lower surfaces; and the lower surface of the substrate comprises solder balls affixed thereto.

10. A circuit assembly comprising:

the substrate according to claim 9;

at least one semiconductor die attached to the upper surface of the substrate;

a printed circuit board attached to the lower surface of the substrate; and bond wires electrically connecting bond pads on the at least one semiconductor die to the substrate.

11. A circuit assembly comprising:

the substrate according to claim 5;

at least one semiconductor die attached to the upper surface of the substrate;

a printed circuit board attached to the lower surface of the substrate; and bond wires electrically connecting bond pads on the at least one semiconductor die to the substrate.

12. The substrate according to claim 3, comprising vias extending through the substrate between the upper and lower surfaces, wherein the vias are offset from one another such that less than 20% of the vias are aligned.

13. The substrate according to claim 12, comprising at least 48 vias.

14. The substrate according to claim 12, wherein:

the vias electrically connect functional Cu or Cu alloy lines on the upper and lower surfaces; and the lower surface of the substrate comprises solder balls affixed thereto.

15. A circuit assembly comprising:

the substrate according to claim 14;

at least one semiconductor die attached to the upper surface of the substrate;

a printed circuit board attached to the lower surface of the substrate; and bond wires electrically connecting bond pads on the at least one semiconductor die to the substrate.

* * * * *

UNITED STATES PATENT AND TRADEMARK OFFICE
CERTIFICATE OF CORRECTION

PATENT NO.   : 6,507,100 B1
DATED        : January 14, 2003
INVENTOR(S)  : Viswanath Valluri et al.

It is certified that error appears in the above-identified patent and that said Letters Patent is hereby corrected as shown below:

<u>Column 6,</u>
Line 35, change "vais" to -- vias --.

Signed and Sealed this

Twenty-second Day of July, 2003

JAMES E. ROGAN
*Director of the United States Patent and Trademark Office*